(12) United States Patent
Holmes et al.

(10) Patent No.: US 7,049,010 B1
(45) Date of Patent: May 23, 2006

(54) POLYMERIC MATERIALS FOR ELECTROLUMINESCENT DEVICES

(75) Inventors: Andrew Bruce Holmes, Cambridge (GB); Beng Sim Chuah, Wirral (GB); Franco Cacialli, Cambridge (GB); Steven Carl Moratti, Cambridge (GB)

(73) Assignee: Cambridge Display Technology Limited, Cambridge (GB)

( * ) Notice: Subject to any disclaimer, the term of this patent is extended or adjusted under 35 U.S.C. 154(b) by 0 days.

(21) Appl. No.: 09/529,873

(22) PCT Filed: Oct. 21, 1998

(86) PCT No.: PCT/GB98/03154

§ 371 (c)(1),
(2), (4) Date: Jul. 27, 2000

(87) PCT Pub. No.: WO99/20711

PCT Pub. Date: Apr. 29, 1999

(30) Foreign Application Priority Data

Oct. 21, 1997 (GB) ............................................. 9722102
Jul. 8, 1998 (GB) ............................................. 9814815

(51) Int. Cl.
*B32B 19/00* (2006.01)
*C08G 75/00* (2006.01)
*C08G 65/34* (2006.01)

(52) U.S. Cl. ........................ 428/690; 428/691; 428/917; 528/373; 528/422; 528/425; 528/397; 528/489

(58) Field of Classification Search ................ 428/690, 428/691, 917; 528/373, 422, 425, 397, 489
See application file for complete search history.

(56) References Cited

U.S. PATENT DOCUMENTS 5,514,878 A 5/1996 Holmes et al. ............... 257/40
5,558,904 A 9/1996 Hsieh et al. ................... 427/66
5,589,320 A * 12/1996 Ohnishi et al. ............. 430/321

FOREIGN PATENT DOCUMENTS

EP 0745658 A1 4/1996
WO WO 92/16023 9/1992

OTHER PUBLICATIONS

Antoniadis et al., "Light–Emitting Diodes Based on Poly(2, 3–Diphenyl–1,4–phenylene Vinylene)," Polymers For Advanced Technologies, vol. 8, No. 7, Jul. 1997, pp. 392–398, XP000695518.

Gettinger et al., "A Photoluminscence Study of Poly(phenylene Vinylene) Derivatives: The Effect of Intrinsic Persistance Length," Journal of Chemical Physics, vol. 101, No. 2, Jul. 15, 1994, pp. 1673–1678.

Gold, J.F. "Short lifetimes of light emitting polymers,"www.math.utah.edu/~gold/doc/lep.pdf.

Hsieh et al. "A new family of highly emissive soluble poly(p–phenylene vinylene derivatives. A step toward fully conjugated blue–emitting poly(p–phenylene vinylenes)." *Journal of the American Chemical Society*, 120:231–232 (1998).

Wan et al., "Halogen Precursor Route To Poly (2,3–Diphenyl–P–Phenylene) Vinylene (DP–PPV): Synthesis, Electroluminescence, And Photoconductivity," Macromolecules, vol. 30, No. 21, Oct. 20, 1997, pp. 6567–6574, XO00720388.

(Continued)

*Primary Examiner*—Duc Truong
(74) *Attorney, Agent, or Firm*—Therese A. Hendricks, Esq.

(57) ABSTRACT

Provided is a conjugated poly(1,4-arylene vinylene) compound comprising an arylene unit having adjacent substituents, said substituents being oriented such as to affect the electronic structure of the compound sufficiently to cause a blue-shift in the photoluminescence and/or electroluminescence of the compound.

28 Claims, 6 Drawing Sheets

OTHER PUBLICATIONS

Wei et al., Surface Modification And Patterning Of Conjugated Polymers With Near–Field Optical Microscopy, Advanced Materials, vol. 8, No. 7, Jul. 1996, pp. 573–576, XP000598874.

Wilking et al., "Comparsion of poly(p–phenylene vinylene) and poly(phenylene vinylene) precursors," Conference proceedings held Aug. 21, 2000, 220$^{th}$ ACS National Meeting, Washington, D.C.

Woo et al., "Optical Spectra And Excitations In Phenylene Vinylene Oligomers," Synthetic Metals, vol. 59, 1993, pp. 13–28, XP002088539.

Wei et al., "Surface Modification And Patterning of Conjugated Polymers With Near–Field Optical Microscopy," Advanced Materials, vol. 8, No. 7, Jul. 1996, pp. 573–576, XP000598874.

Antoniadis et al., "Light–Emitting Diodes Based On Poly(2, 3–Diphenyl–1,4–phenylene Vinylene)," Polymers For Advanced Technologies, vol. 8, No. 7, Jul. 1997, pp. 392–398, XP000695518.

Wan et al., "Halogen Precursor Route To Poly (2,3–Diphenyl–P–Phenylene) Vinylene (DP–PPV): Synthesis, Electroluminescene, And Photoconductivity," Macromolecules, vol. 30, No. 21, Oct. 20, 1997, pp. 6567–6574, XP000720388.

Gettinger et al., "A Photoluminscene Study of Poly(phenylene Vinylene) Derivates: The Effect of Intrinsic Persistance Length," Journal of Chemical Physics, vol. 101, No. 2, Jul. 15, 1994, pp. 1673–1678, XP002088538.

Woo et al., "Optical Spectra And Excitations In Phenylene Vinylene Oligomers," Synthetic Metals, vol. 59, 1993, pp. 13–28, XP002088539.

Antoniadis et al., "Light–Emitting Diodes Based on Poly(2, 3–Diphenyl–1,4–phenylene Vinylene), " Polymers For Advanced Technologies, vol. 8, No. 7, Jul. 1997, pp. 392–398, XP000695518.

Gettinger et al., "A Photoluminescence Study of Poly(phenylene Vinylene) Derivatives: The Effect of Intrinsic Persistance Length," Journal of Chemical Physics, vol. 101, No. 2, Jul. 15, 1994, pp. 1673–1678, XO002088538.

Gold, J.F., "Short lifetimes of light emitting polymers," www.math.utah.edu/~gold/doc/lep.pdf.

Hsieh et al. "A New family of highly emissive soluble poly(p–phenylene vinylene derivatives. A step toward fully conjugated blue–emitting poly(p–phenylene vinylenes)" *Journal of the American Chemical Society,* 120:231–232 (1998).

Wan et al., "Halogen Precursors Route To Poly (2,3–Diphenyl–P–Phenylene) Vinylene (DP–PPV): Synthesis, Electroluminescence, And Photoconductivity," Macromolecules, vol. 30, No. 21, Oct. 20, 1997, pp. 6587–6574, XO000720388.

Wei et al., Surface Modification And Patterning Of Conjugated Polymers With Near–Field Optical Microscopy,Advanced Materials, vol. 8, No. 7, Jul. 1996, pp. 573–576, XP000598874.

Wilking et al., "Comparsion of poly(p–pheneylene vinylene) and poly(phenylene vinylene) precursors," Conference proceedings held Aug. 21, 2000, 220$^{th}$ ACS National Meeting, Washington, D.C.

Woo et al., "Optical Spectra And Excitations In Phenylene Vinylene Oligomers, " Synthetic Metals, vol. 59, 1993, pp. 13–28, XP002088539.

* cited by examiner

POLYMERIC MATERIALS FOR ELECTROLUMINESCENT DEVICES

FIELD OF THE INVENTION

The present invention is directed to polymers for use in electric, electronic, optical and optoelectronic devices, e.g. polymer-based light-emitting devices, such as light emitting diodes (LEDs). In particular, the present invention concerns poly(1,4-arylene vinylene)s which have improved photoluminescence and/or electroluminescence efficiencies.

BACKGROUND OF THE INVENTION

The potentially high photoluminescent quantum yield in organic semiconductors has made light emission through charge injection under an applied field (electroluminescence) a reality. This has thus resulted in the use of organic materials for LEDs, with the use of polymers having an advantage over smaller organic compounds in improving structural stability and processibility of the organic layers.

The first polymer-based LEDs consisted of an emissive layer of poly(1,4-phenylene vinylene) (PPV) sandwiched between indium tin oxide (ITO) as the hole injection electrode and aluminium or calcium as the electron-injecting electrode (Burroughes et al., Nature, 1990, 347, 539). This has been followed in other polymers for LED applications, with emphasis on the tuning of the emission colour by controlling the substitution pattern and the effective conjugation length in the polymer.

The route used for the synthesis of PPVs for LEDs has been predominantly the Wessling sulphonium salt precursor route (U.S. Pat. No. 3,401,152/1968 Wessling et al.) while another important method of Gilch (Gilch et al., J. Poly. Sci. 1-A, 1966, 4, 1337), involved dehydrohalogenation of bis (halomethyl) benzene monomers with excess potassium t-butoxide to directly obtain the conjugated polymer. This protocol has been applied to the red emissive poly(2,5-dialkoxy-1,4-phenylene vinylene)s which have a typical absolute PL efficiency of ca. 15–20%. Most commonly the preparation has referred to poly[2-methoxy-5(2'-ethylhexyloxy)-1,4-phenylene vinylene] (Wudl, U.S. Pat. No. 5,189,136/1990). A modification of this route by Swatos and Gordon, based on the chloro-precursor route, used one equivalent of base to form the chloro-substituted soluble precursor polymer, which was then thermally converted to form the fully conjugated polymer [Swatos and Gordon, Polym. Prepr., 1990, 31 (1), 505]. This route has since been used by various groups to make alkyl-, aryl-, and alkoxy-substituted PPVs (Hsieh et al., Adv. Mater., 1995, 7, 36; Polym. Adv. Tech, 1997, 8, 392; U.S. Pat. No. 5,558,904; Sarnecki et al., Synth. Met., 1995, 69, 545).

There is still a need to provide photoluminescent and electroluminescent polymers, which are easily manufactured and are processible. There is also still a need for polymers having improved photoluminescence and electroluminescence efficiencies.

SUMMARY OF THE INVENTION

It is an object of the present invention to solve the above problems. Accordingly, the present invention provides a conjugated poly(1,4-arylene vinylene) compound comprising an arylene unit having adjacent substituents, said substituents being oriented such as to affect the electronic structure of the compound sufficiently to cause a blue-shift in the photoluminescence and/or electroluminescence of the compound.

The present invention also provides use of a poly(arylene vinylene) compound comprising an arylene unit having adjacent substituents, in an electric, electronic, optical or optoelectronic component or device for producing blue-shifted electroluminescence or photoluminescence in said device.

The substituents may affect the electronic structure of the compound by exerting a steric or stereoelectronic effect, such as a twisting of the polyester backbone to accommodate their steric bulk, which twisting leads to a reduction in the conjugation of the compound. The reduction in conjugation in turn leads to a blue-shift in luminescence. Additionally, the substituents may possess one or more lone pairs of electrons which may interfere with the conjugation in the polymer to cause the blue-shift in luminescence.

The blue-shift is a blue-shift as compared with a hypothetical compound, this being the same polymer in which the orientation of the substituents (whether resulting from their steric bulk or some electronic effect) has no effect on the electronic structure of the compound. Thus, for example, the blue-shift may be a blue-shift resulting from a reduction in conjugation caused by twisting the backbone of the polymer to the degree required to accommodate the steric bulk of the substituents.

The present invention describes the surprising discovery of efficient blue-shifted emission from poly-1,4-(arylene vinylene)s having adjacent substituents, preferably 2,3-disubstituted PPV-based materials and their use in LEDs. This invention explores unconventional substitution patterns, e.g. in the case of poly(phenylene vinylenes) (PPVs) at the 2,3-positions on the phenyl ring as opposed to the standard 2,5-disubstituted PPVs and thus provides a means of tuning the colour of emission. In addition, the present invention provides a luminescent polymer that is both soluble and directly obtainable, preferably by the Gilch route. The invention refers to the synthesis of improved materials and their application in organic LEDs.

The present invention also provides materials-based light-emitting devices, such as light emitting diodes (LEDs), in which the use of a layer of emissive polymer enables efficient devices to be constructed using aluminium or calcium cathodes. The polymer is a poly(1,4-arylene vinylene) having adjacent aryl substituents, preferably a poly(1,4-phenylene vinylene) (PPV) derivative, having substituents on the 2,3-positions of the phenylene ring. This substitution pattern produces a blue-shifted emission and high PL and EL device efficiencies. The polymerisation route is simple, the polymer is soluble, and displays good film forming properties with high photoluminescence in the solid state.

The invention will now be described in further detail by way of example only, with reference to the accompanying drawings, in which:

DETAILED DESCRIPTION

The electroluminescent (EL) devices according to the present invention are injection-type diodes in which at least one active layer (EL layer) and one or more charge transport layers (if desired) are sandwiched between two different conducting layers (electrodes). One electrode is a hole-injecting translucent or transparent electrode while the other is an electron-injecting electrode. The electrodes are electrically connected to each other and to a source of current to create a complete circuit. Improved efficiencies may be obtained using bilayer devices with PPV or hole transporting layers e.g. poly(vinyl carbazole) (PVK).

This invention refers in one specific embodiment to the polymer, poly[(2,3-dibutoxy)-1,4-poly(phenylene vinylene)] 1 which can be prepared using the dehydrohalogenation method with base (potassium tert-butoxide). The resultant polymer has high molecular weight and its alkyl chains enable solubility in organic solvents such as chloroform and tetrachloroethane. Surprisingly, the solid film fluoresces with high efficiency (absolute PL efficiency 40%) in the yellow green region despite having alkoxy substituents. The present invention also concerns a further embodiment relating to the polymer 2. In addition to its emissive properties in PL and EL devices it has the potential to serve as a component of a sensor owing to its affinity for metal ions.

Figure 1:
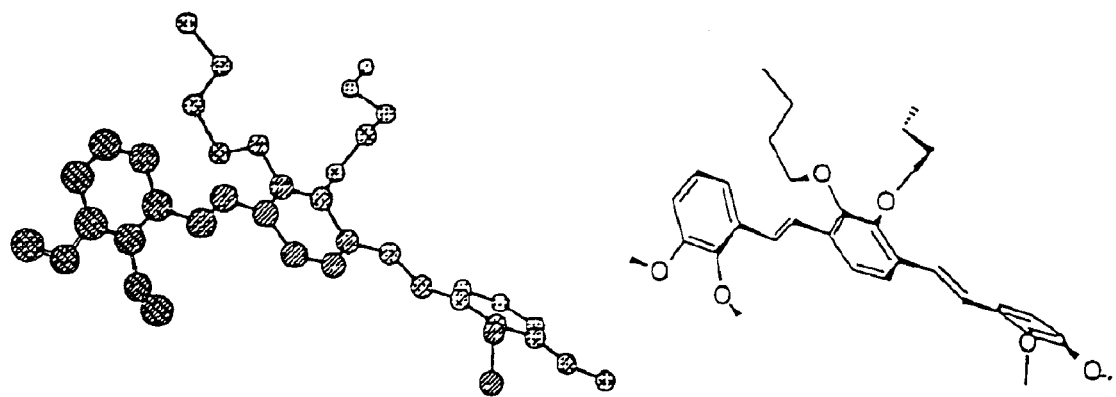
FIG. 1 shows the X-ray crystal structure of oligomer 9.
Figure 2:
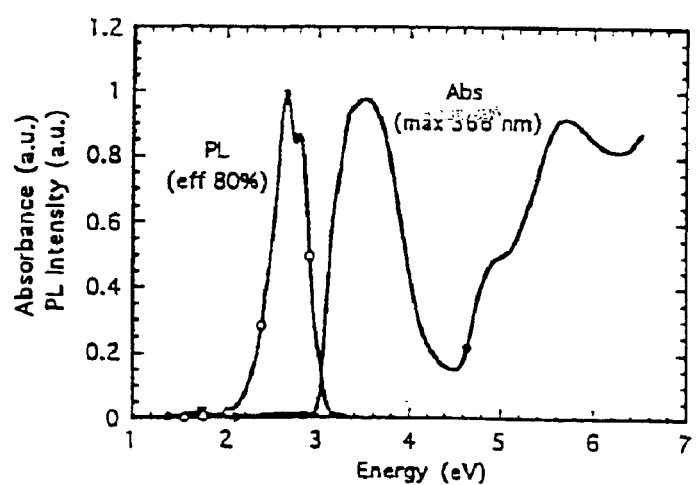
FIG. 2 shows absorption and PL spectra of films of oligomer 9.
Figure 3:
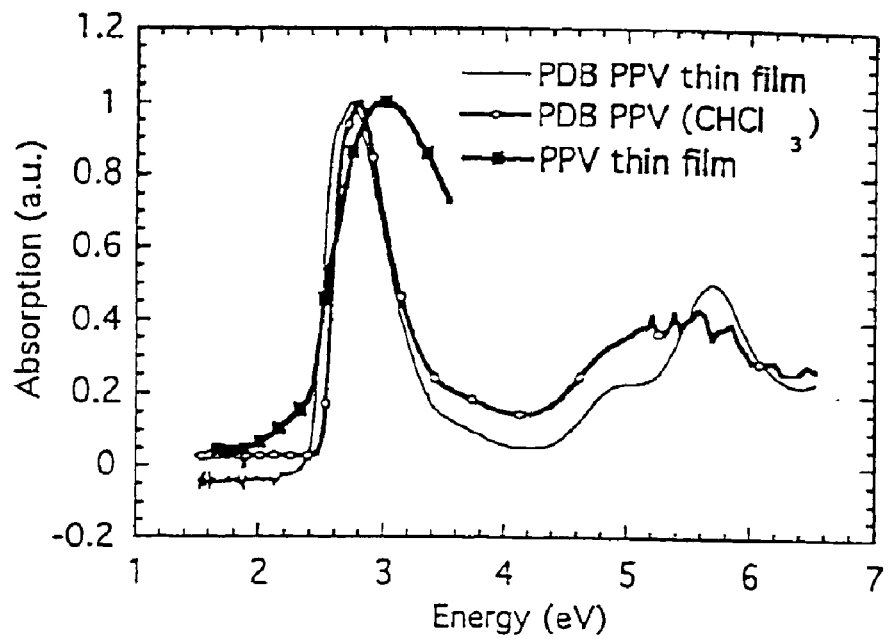
FIG. 3 shows absorption spectra of PDB PPV 1 compared with a PPV film.
Figure 4:
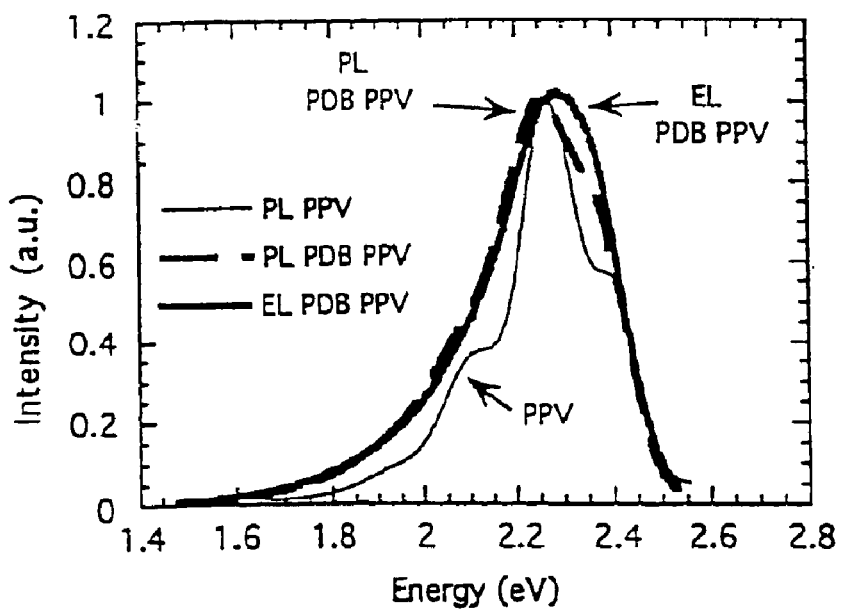
FIG. 4 shows PL spectra of PDB PPV 1 compared with PPV film and EL spectra of a bilayer device (configuration ITO/PPV/PDB-PPV 1/Ca)
Figure 5:
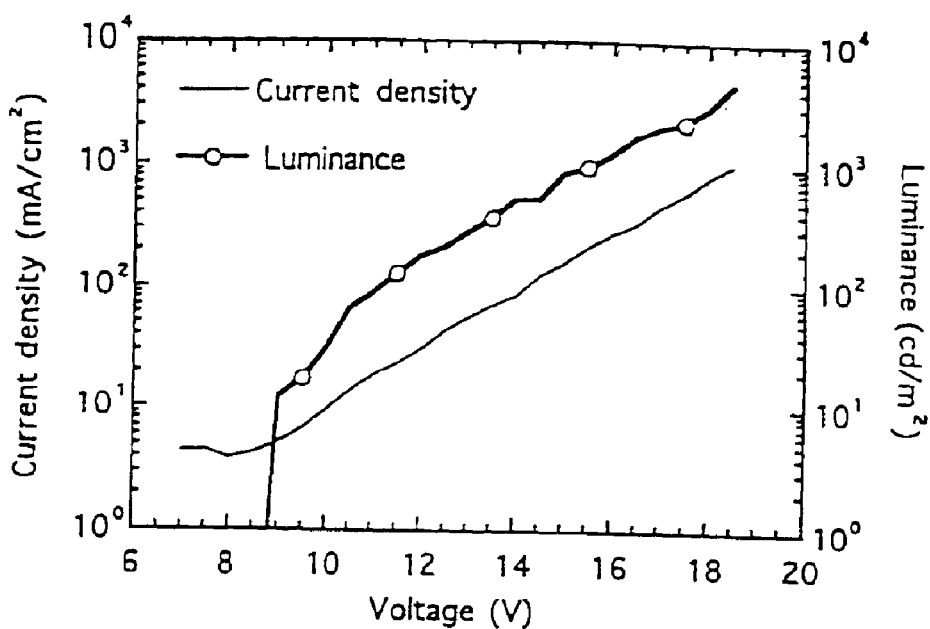
FIG. 5 shows a plot of current density vs. applied voltage for a bilayer device (configuration ITO/PPV/PDB-PPV/Ca)
Figure 6:
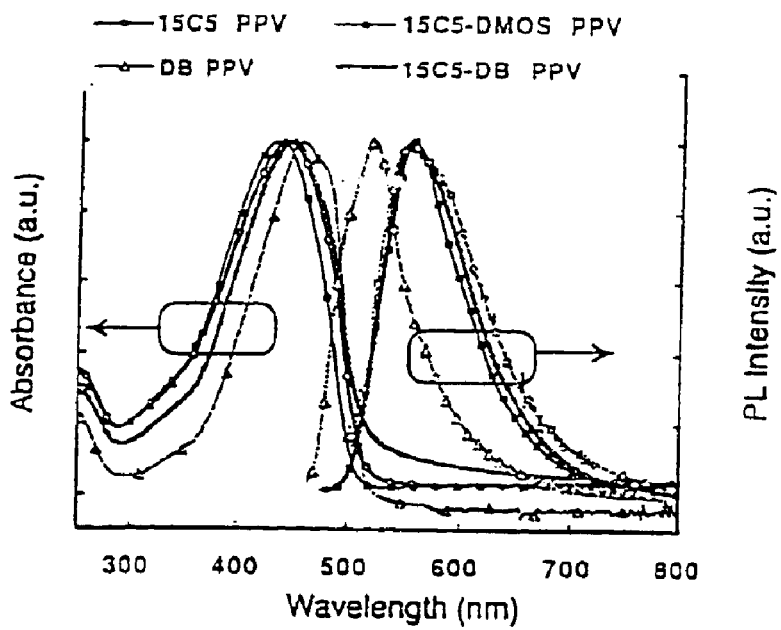
FIG. 6 shows absorption and photoluminescence spectra of films of copolymers 12 and 13.
Figure 7:
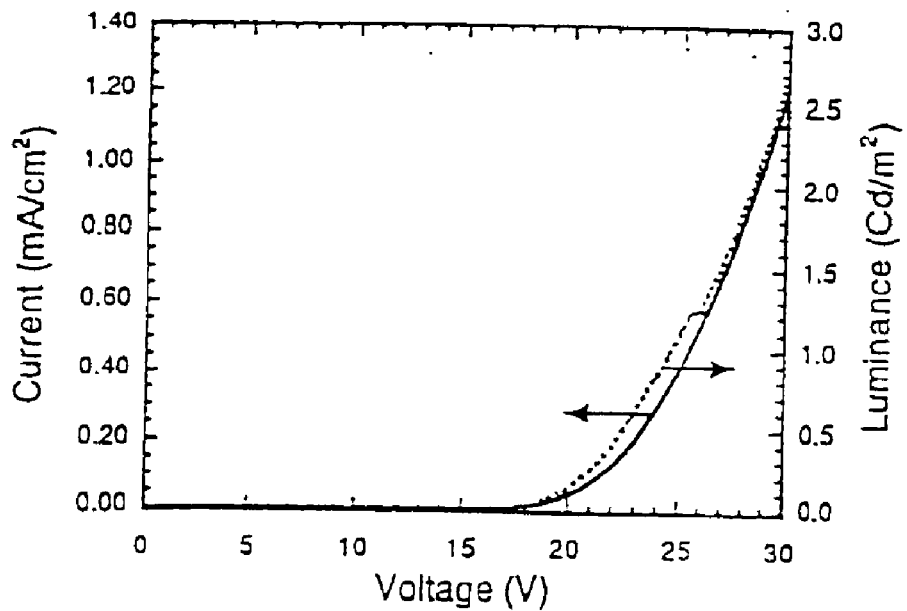
FIG. 7 shows I-V-L plots for single layer device ITO/15C5-DB PPV 12/Al.
Figure 8:
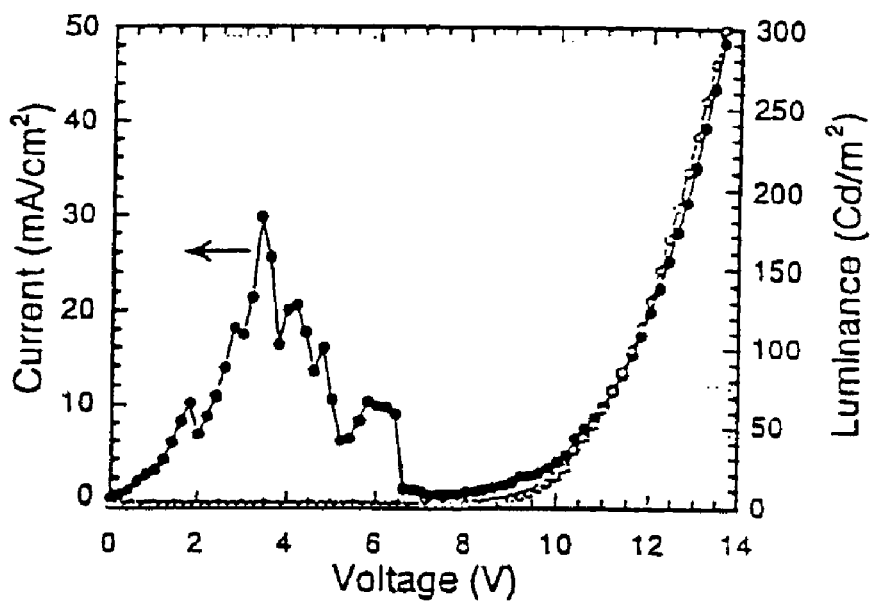
FIG. 8 shows I-V-L plots for single layer device ITO/15C5-DMOS PPV 13/Al.
Figure 9:
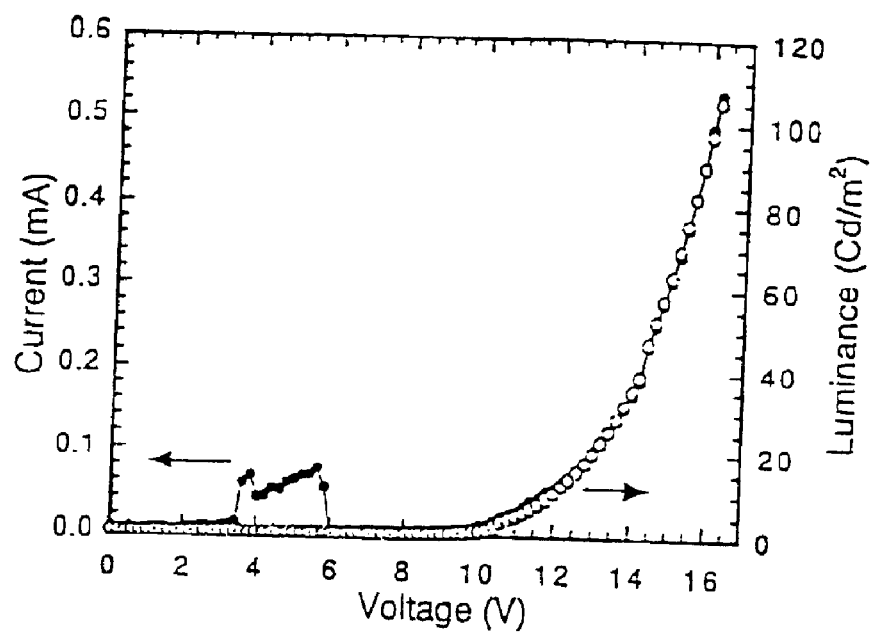
FIG. 9 shows I-V-L plots for double layer device ITO/PPV/15C5-DMOS PPV 13/Al, at drive voltages ca. 14V, EL quantum efficiency up to 2.0%.
Figure 10:
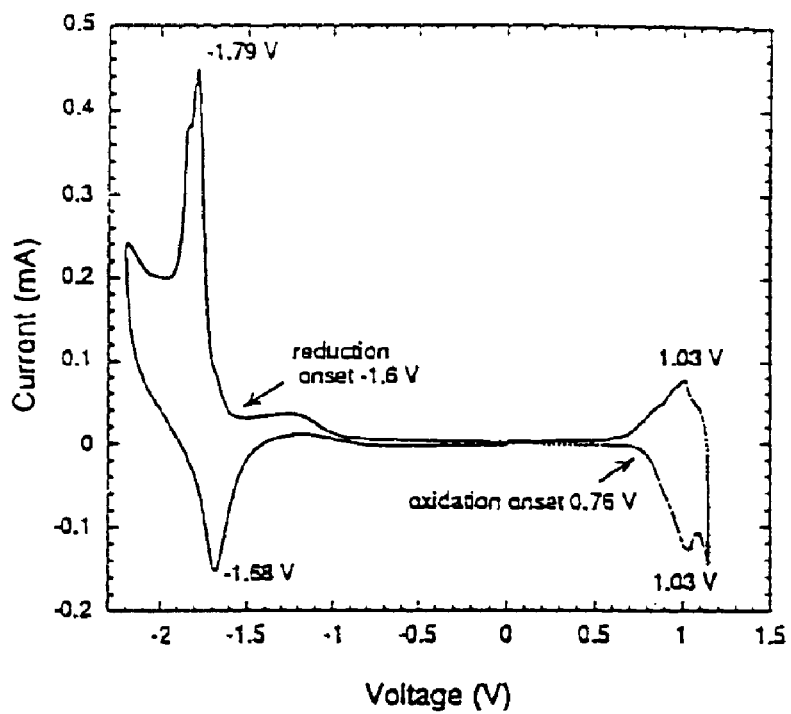
FIG. 10 shows a CV plot of 15C5-DB PPV copolymer 12.
Figure 11:
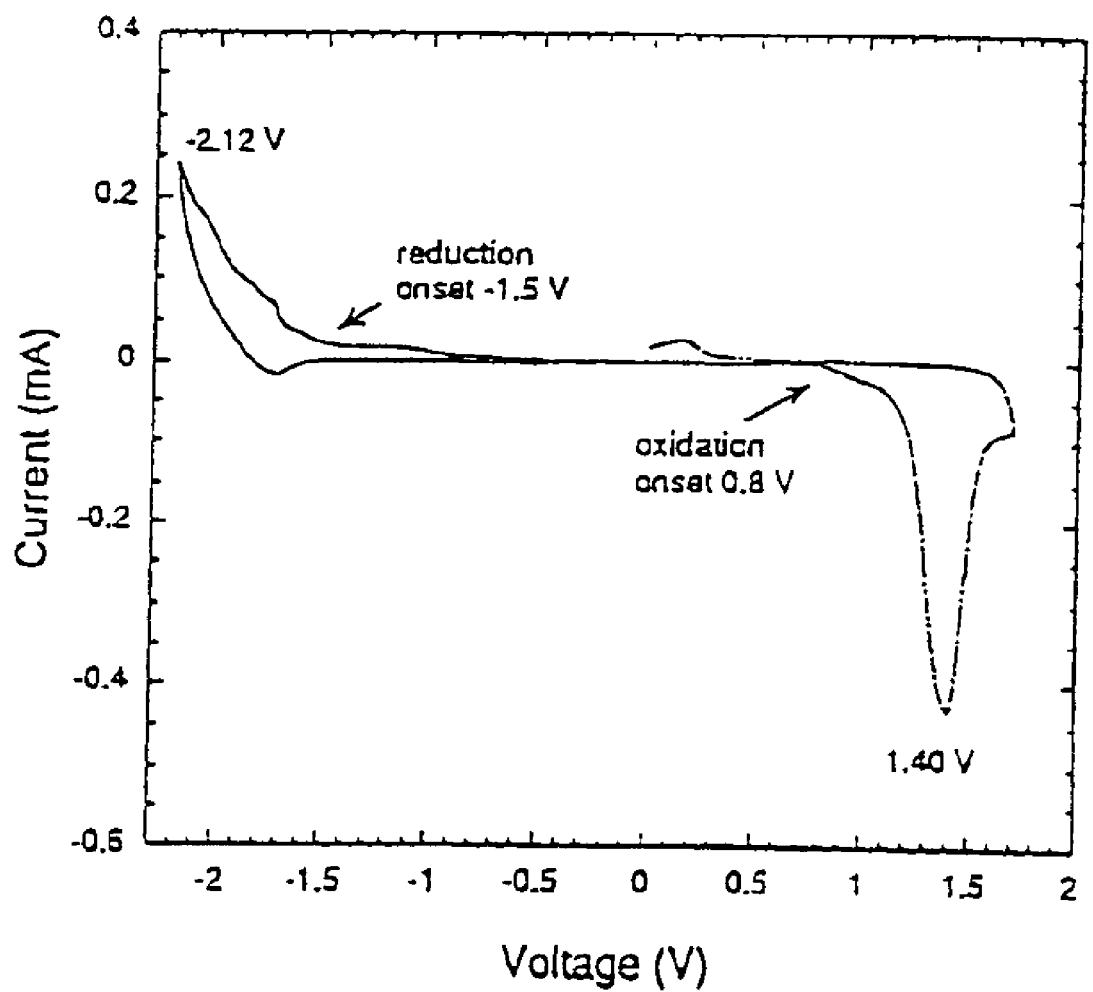
FIG. 11 shows a CV plot of 15C5-DMOS PPV copolymer 13.

In a further embodiment, the invention extends to the fluorescent oligomer 9 which has been synthesised using the Wadsworth-Emmons reaction of a dialkoxybenzyl bisphosphonate 8 and dialkoxy-benzaldehyde 7. Evidence for the origin of the blue-shifted emission and possible high fluorescence efficiency comes from the single crystal X-ray study of 9 which shows that the aromatic rings are twisted in a notable manner, thus resulting in the disruption of the effective conjugation length of the polymer backbone. The localisation of the conjugation could also be due to the cisoid-like disposition of the styryl substituents in 9 (see FIG. 1).

Scheme 1

Structure of the poly[(2,3-dibutoxy)-1,4-poly(phenylene vinylene)] (PDB-PPV) 1 and the crown ether analogue 2

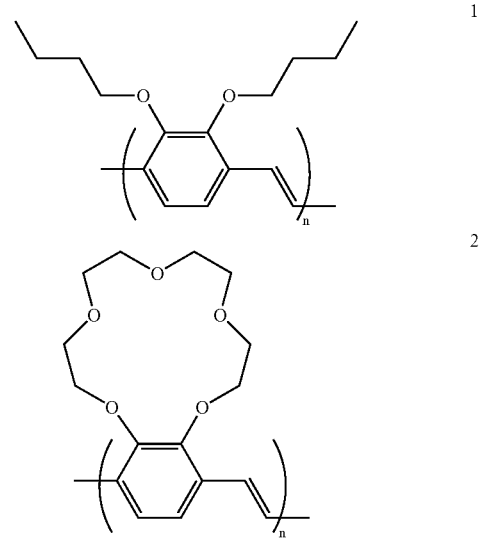

The crown ether analogue 2 is also fluorescent. It can be prepared as shown in Scheme 2 below:

Scheme 2

Preparation of 15C5 crown ether 2

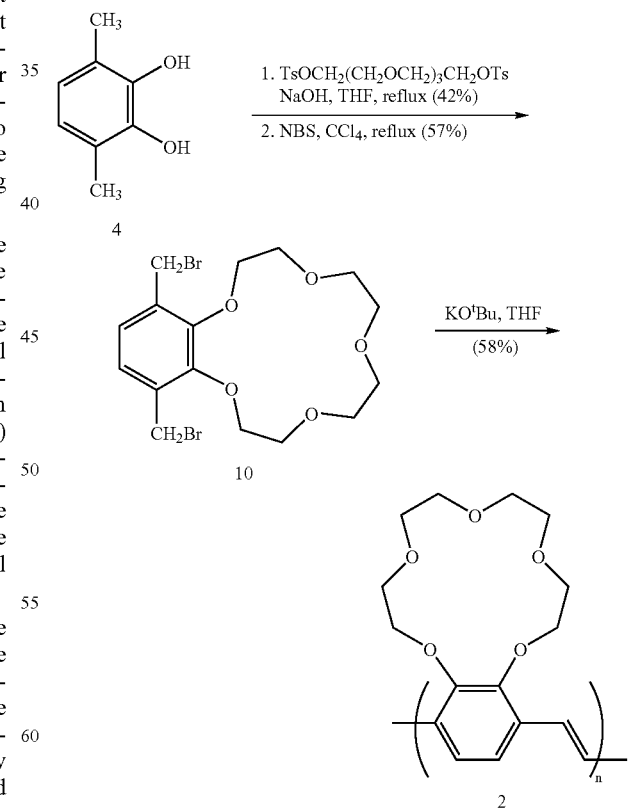

As the polymer 2 is also luminescent it can be used advantageously in light emitting electrochemical devices and other devices where chelation of various metal ions, preferably lithium, can lead to ionically doped materials fabricated out of a homogeneous phase rather than from a blend of more than one polymer which may phase-separate. Such doping can lead to reduced barriers for charge injection into the emissive layers. Statistical copolymers derived from dehydrohalogenation condensation polymerisation of the building block 10 with either the DMOS precursor 11 or the dibutoxy precursor 6 afford efficient devices (Scheme 3). The ratio of m:n may range from 10:1 to 1:10, preferably ca. 1:1.

Based on the illustrative examples it is evident that highly efficient devices can be obtained by the dehydrohalogenation route to prepare adjacently substituted arylene vinylene polymers, such as 2,3-disubstituted-1,4-phenylene vinylene polymers from monomers carrying aryl, heteroaryl, alkyl, and branched alkyl substituents linked either by carbon or heteroatom linkages to the aromatic backbone of the polymer.

The adjacent substituents can be selected from H, R, RO—, RS—, and RR'N—, where R=$C_5H_{11}$, $C_6H_{13}$, $C_7H_{15}$ Scheme 3

Statistical copolymers 12 and 13

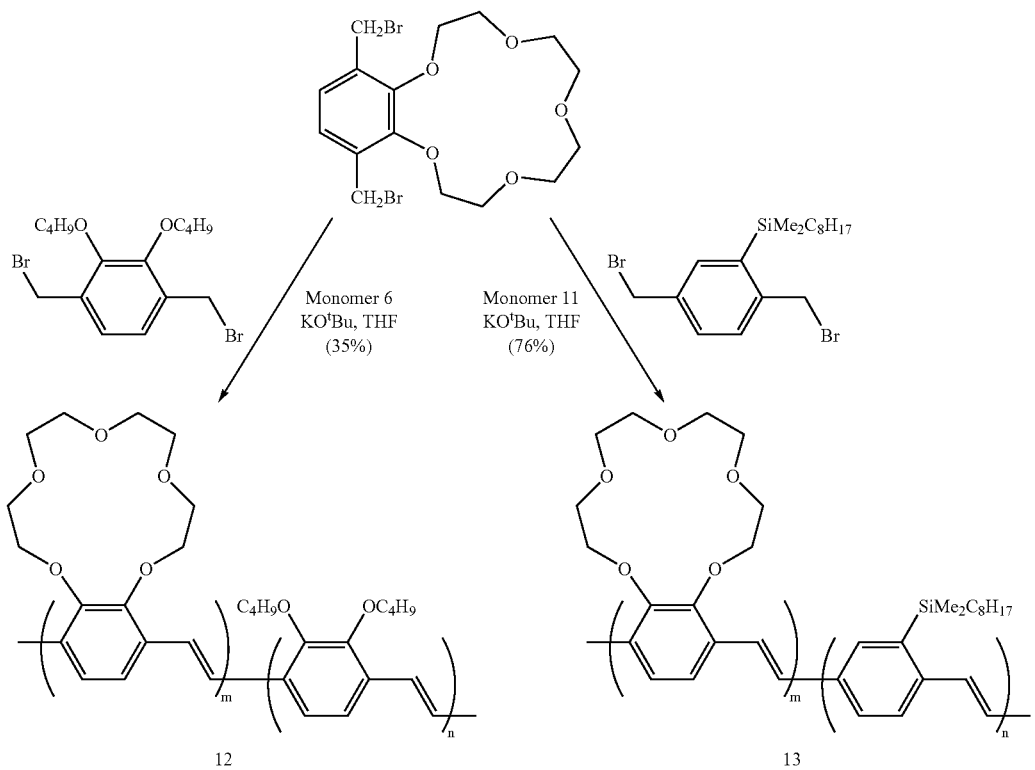

Two layer devices, or, fabricated using 1 as follows. A layer of a PPV precursor polymer, fabricated according to a sulphonium precursor route ["Precursor route chemistry and electronic properties of poly(p-phenylene vinylene), poly(2, 5-dimethyl-p-phenylene vinylene) and poly(2,5-dimethoxy-p-phenylene vinylene)" P. L. Burn, D. D. C. Bradley, R. H. Friend, D. A Halliday, A. B. Holmes, R. W. Jackson and A. Kraft, *J. Chem. Soc. Perkin Trans.* 1, 1992, 3225–3231], was spin-coated onto a glass plate coated with ITO and thermally converted to PPV. In the other type of bilayer device, a transporting layer of PVK was spin-coated from solution directly onto ITO.

Next, a layer of the polymer poly[(2,3-dibutoxy)-1,4-poly (phenylene vinylene)] (PDB-PPV) 1 was spin-coated onto the PPV layer followed by a layer of aluminium or calcium deposited under vacuum onto the polymer layer. Contacts were attached and a connection made to a DC power source. Application of a forward bias voltage resulted in emission of yellow-green light with an emission maximum at about 2.3 eV (ca. 550 nm), and a brightness in excess of 4,500 cd/m$^2$. Internal efficiencies of about 1.5% were observed with calcium as the cathode.

or $C_8H_{17}$, etc. and branched derivatives thereof, and aryl (Ar) where Ar=aryl or heteroaryl or fused derivatives thereof. Preferable substituents are those which solubilise the final polymer. These include branched alkyl, aralkyl and the corresponding alkoxy derivatives. The most preferred substituent is the butyloxy, and other preferred substituents are ethylhexyl(oxy) and 3',7'-dimethyloctyl (oxy). Other carbon chains such as alkyl or alkoxy substituents carrying up to ten carbon atoms and branching substituents are advantageous. Such substituents could be selected in any combination, and are not limited to those listed.

Similar effects can be achieved with any conjugated polyarylenevinylene polymer or other conjugated polymer (polyfluorene, polythienylene, polynaphthalene, polyphenylene, polypyridine, polyquinoline, polyquinoxaline, poly[thienylene-co-phenylene] etc.) or a copolymer arising from a fluorescent unit carrying a distyrylbenzene fragment with the 2,3-disubstitution at least on the aromatic rings. The preferred polymers arise from poly(arylene vinylene) conjugated units carrying an adjacent disubstitution pattern. Most preferably, 2,3-disubstituted bishalomethylbenzene derivatives serve as starting monomers for the conjugate polymer products.

The preferred synthesis involves dehydrohalogenation condensation polymerisation using potassium t-butoxide as a base in various solvents such as tetrahydrofuran or dioxane. The resulting polymer is solution processible and has a good film forming property for polymer electroluminescent devices. Polymers for 1,4-bis(halomethylbenzene) monomers have been disclosed in U.S. Pat. No. 5,558,904. These afforded insoluble polymers. The adjacent disubstitution in the present invention is achieved owing to the method of synthesis of the polymer, and leads to a product polymer that is solution processible, and having a surprising florescence emission wavelength and efficiency.

Previous examples with a 2,3-diphenyl (diaryl) substitution pattern as disclosed in U.S. Pat. No. 5,558,904 would not be expected to demonstrate these features, based on the lack of solubility of the final polymer. This is disclosed in detail in H. Antoniadis et al., *Polym. Adv. Tech.*, 1997, 8, 392. In that case solution processibility required the use of a precursor route to allow processing and generation of the final polymer.

EXAMPLES

A method of preparing the conjugated polymer PDB-PPV 1 involves the preparation of the monomer of formula Br—CH$_2$—Ar—CH$_2$—Br which is subjected to polymerisation with six equivalents of base (potassium tert-butoxide preferably in THF or dioxane) to give the desired polymer, which is soluble in organic solvents such as chloroform and tetrachloroethane. The synthesis of the polymer is shown in scheme 4 below:

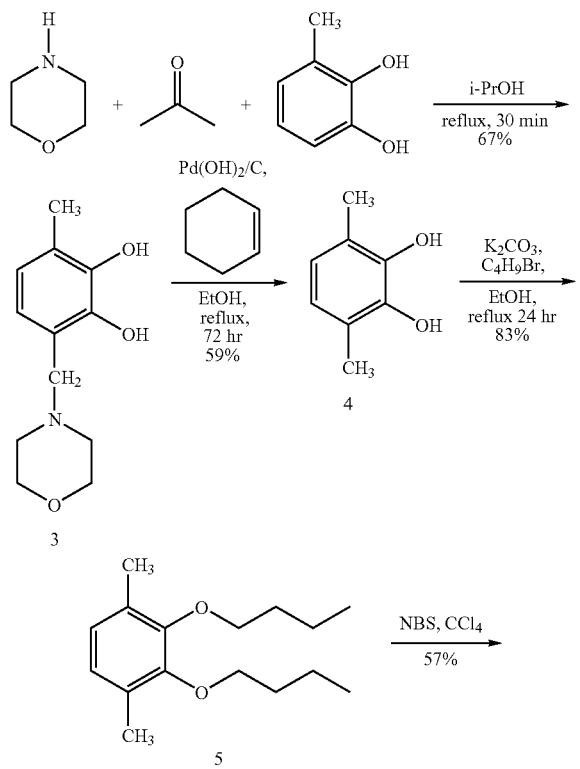

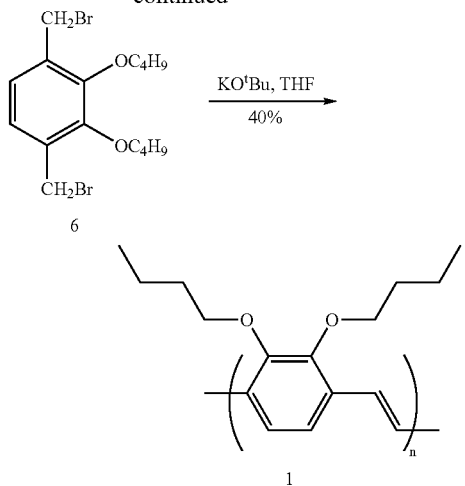

Example 1

Preparation of Monomer 6

Methyl catechol derivative 3 was synthesised by performing a Mannich reaction with formaldehyde and morpholine following the method described by Helgeson et al. (*J. Am. Chem. Soc.*, 1997, 99, 6411). Transfer hydrogenation using palladium hydroxide on carbon to remove the morpholine group in the presence of a hydrogen donor (Hanessian et al., *Synthesis*, 1981, 118, 396) subsequently produced the dimethyl catechol 4 in reasonable yield (59%). O-alkylation was then carried out using a copious excess of potassium carbonate and dibutyl bromide to give a reasonably high yield (83%) of dialkoxy-xylene 5. Radical bromination of the xylene with a slight excess of N-bromosuccinimide in carbon tetrachloride as given in Gruter et al, *J. Org. Chem.*, 59, 4473 gave the monomer 6 in comparatively high yield (57%).

Example 2

Preparation of Polymer 1

A degassed solution of the monomer 6 (0.24 g, 0.6 mmol) in dry THF (16 cm$^3$) was added slowly over 20 min to a degassed solution of potassium tert-butoxide (0.41 g, 3.6 mmol) in dry THF (16 cm$^3$) at room temperature. The reaction mixture was stirred at room temperature under nitrogen for 18 h, after which it was poured into methanol. The resultant yellow precipitate was collected by filtration and re-precipitated into methanol. The polymer 1 was collected as a bright yellow solid (60 m, 40%).

Found: C, 76.6; H, 9.1; Br, 0; $[C_{16}H_{22}O_2]_n$ requires C, 78.0; H, 9.0; Br, 0%

GPC assay in CHCl$_3$ revealed $M_w$ 2,120,000, $M_n$ 361,000 and $M_w/M_n$ 5.9;

$\lambda_{max}$ (CHCl$_3$)/nm 444; $\lambda_{max}$ (film)/nm 450;

PL emission (max)/nm 551 (2.25 eV); PL efficiency 40%; EL emission (max)/eV 2.28.

Example 3

Fabrication of a 2-Layer LED with Polymer 1

A film of PPV (ca. 100 nm in thickness was prepared by spin-coating a solution of a sulphonium precursor polymer onto a glass plate coated with indium tin oxide and thermally converting the film at 230° C. in vacuum for 6 h. A 19% (w/v) solution of the polymer 1 in chloroform was spin-coated on top of the converted PPV film to give a uniform film of about 100 nm thick. The structures were placed on top of a mask, permitting the deposition of aluminium or calcium on the coated film surface inside a metal evaporator. Metal layers were of typically 500–1000 Å in thickness. Metal contacts were then attached to the electrodes and connected to a DC source. The active device area was typically 4 mm².

The bilayer device (ITO/PPV/PDB-PPV/Ca) shows maximum efficiency 1.5% with luminance in excess of 4,500 cd/m² with turn-on voltage at 9V. A bilayer device was also constructed with PVK as the hole-transporting layer produced a maximum efficiency of 0.6% with Al cathodes.

Example 4

Preparation of the Model Oligomer 9

Scheme 5

Preparation of dialkoxy-substituted oligomer 9

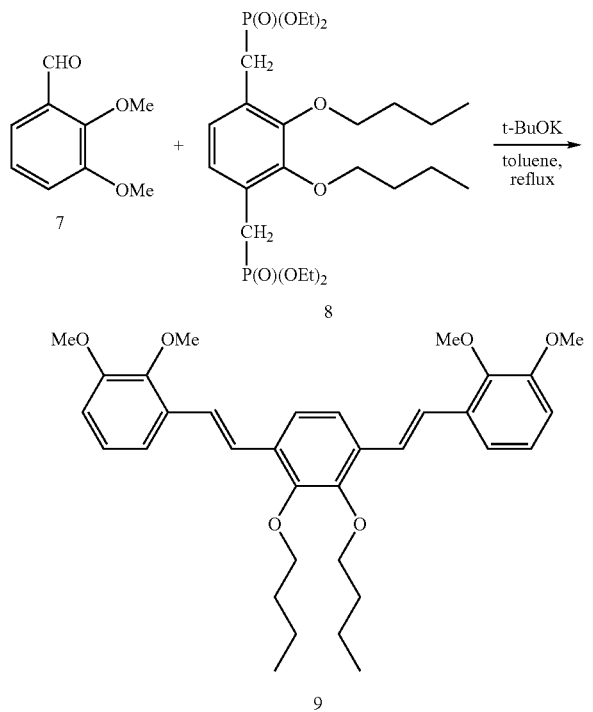

9 is obtained as pale green crystals, m.p. 80–81; $\lambda_{max}$ (CHCl$_3$) 362 nm, (film) 366 nm; blue-green fluorescence, PL$_{max}$ (film) 2.6 eV A mixture of the 2,3-dimethoxybenzaldehyde 7 (0.33 g, 2.0 mmol) and 1,4-[(2,3-dibutoxy) xylylene]-bis (diethylphosphonate) 8 (0.52 g, 1.0 mmol) in toluene (10 cm³) was stirred and heated to ca. 100° C. under an atmosphere of nitrogen. Potassium tert-butoxide (0.35 g, 3.0 mmol) was added all at once into the hot mixture resulting in a colour change to orange-brown. The mixture was then heated to reflux for 4 h. After allowing to cool to room temperature, toluene was added (20 cm³) followed by hydrolysis with acetic acid (10% aq. 20 cm³). The organic layer was separated, washed with water until the organic layer tested neutral. The organic fraction was the dried, followed by removal of the solvent under reduced pressure to yield a yellow oil. The product 9 was isolated by column chromatography (9:1 hexane:diethyl ether v/v) and further purified by recrystallisation from methanol to give greenish-white needles (0.35 g, 64%).

M.p. 80.0–81.0° C.;

$\delta_H$ (250 MHz; CDCl$_3$) 7.49–7.47 (6H, m, Ar—H & CH═CH), 7.30–7.26 (2H, m, ArH$_a$), 7.08 (2H, t, J 8.0, ArH$_b$), 6.86–6.83 (2H, m, ArH$_c$), 4.04 (4H, t, J 6.6, ArOCH$_2$), 3.89–3.87 (12H, m, ArOCH$_3$), 1.88–1.77 (4H, m, CH$_2$), 1.64–1.49 (4H, m, CH$_2$), 1.00 (6H, t, J 7.2, CH$_3$);

$\delta_C$(63.5 MHz; CDCl$_3$) 153.1 (C, Ar), 150.6 (C, Ar); 147.1 (C, Ar), 132.0 (C, Ar), 131.7 (C, Ar), 124.2 (CH, Ar), 124.1 (CH, Ar), 123.4 (CH, Ar), 121.0 (CH, Ar), 117.9 (CH, Ar), 111.3 (CH, Ar), 73.7 (OCH$_2$), 61.1 (OCH$_2$), 55.8 (OCH$_2$), 32.4 (CH$_2$), 19.4 (CH$_2$), 14.0 (CH$_3$);

m/z (CI) 547 (MH$^+$, 75%), 402 (10), 166 (40), 72 (C$_4$H$_8$O, 60), 52 (C$_4$H$_4$, 70);

Found (MH$^+$) 547.3060; C$_{34}$H$_{42}$O$_6$ requires 546.2981;

Found: C, 74.7; H, 7.8, C$_{34}$H$_{42}$O$_6$ requires C, 74.7; H, 7.8%;

$\lambda_{max}$ (CHCl$_3$/nm) 366; $\lambda_{max}$ (film/nm) 362;

PL$_{max}$ (film/nm) 477; PL efficiency (solid state) ca. 80%.

The X-ray structure of the oligomer 9 (see FIG. 1) shows an unusual cisoid-like conformation around the trans-vinylene bond. The benzene rings are twisted out of the plane of the vinylene linkage by about 15° and the benzene rings in turn are twisted at a 30° angle from one another in a regular pattern. This twist will eventually cause an interruption in the polymer backbone conjugation after every 4 benzene rings. The oligomer shows high PL efficiency (ca.8±8%) in the solid state.

Synthesis of Monomers

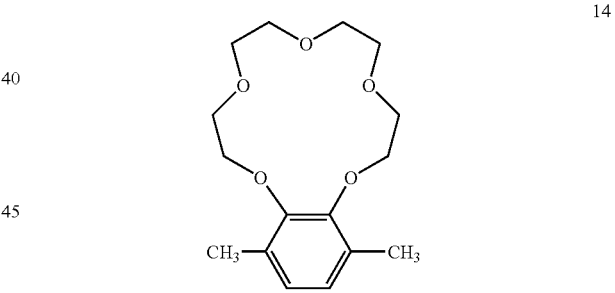

3,6-Dimethylbenzo-15-crown-5, 14

To a solution of dimethyl catechol 4 (2.5 g, 18 mmol) in tetrahydrofuran (110 cm³) under a nitrogen atmosphere was added sodium hydroxide (1.44 g, 36 mmol). The mixture was left stirring for a hour, and a solution of tetraethyleneglycol-di-p-tosylate (9.05 g, 18 mmol) in tetrahydrofuran (50 cm³) was added in dropwise over 30 min. The mixture was refluxed for 22 h. The mixture was cooled, the solvent removed and the residue taken up in dichloromethane (200 cm³). The organic layer was extracted with water (3×100 cm³) and dried over MgSO$_4$. The solvent was removed under reduced pressure to yield a brown crude. The benzo crown ether was isolated by flash column chromatography (hexane followed by 9:1 hexane:ethyl acetate v/v) to yield the ether 14 as a colourless oil (2.2 g, 41%). R$_f$ 0.25 (6:4 hexane:ethyl acetate v/v;

$\nu_{max}$ (KBr)/cm$^{-1}$ 2860, 1580, (Ar), 1281, 1134, 1081 (C—O);

$\delta_H$ (400 MHz; CDCl$_3$) 6.79 (2H, s, Ar—H), 4.11 (2×2H, t, J 5.2, Ar—OCH$_2$), 3.96 (2×2H, t, J 5.2, ArO—CH$_2$CH$_2$), 3.74 (4×2H, m, OCH$_2$), 2.22 (6H, s, ArCH$_3$);

$\delta_C$ (400 MHz; CDCl$_3$) 150.6 (C, Ar), 150.6 (C, Ar), 129.8 (C, Ar), 129.8 (C, Ar), 125.4 (CH, Ar), 125.4 (CH, Ar), 71.9 (CH$_2$), 71.9 (CH$_2$), 71.1 (CH$_2$), 71.1 (CH$_2$), 70.6 (CH$_2$), 70.6 (CH$_2$), 70.3 (CH$_2$), 70.3 (CH$_2$), 15.8 (CH$_3$), 15.8 (CH$_3$);

m/z (CI) 297 (MH$^+$, 20%), 244 (5), 164 (10);

Found (MH$^+$) 297.1702; C$_{16}$H$_{24}$O$_5$ requires 296,1624;

Found: C, 64.4; H, 8.1; C$_{16}$H$_{24}$O$_5$ requires C, 64.8; H, 8.2%

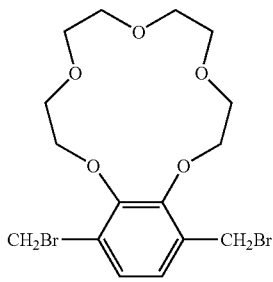

3,6-Bis(bromomethyl)-benzo-15-crown-5, 10

A mixture of the benzo-crown ether 14 (1.77 g, 5.97 mmol), N-bromosuccinimide (2.18 g, 12.2 mmol) and benzol peroxide (0.14 g, 0.6 mmol) in carbon tetrachloride (50 cm$^3$) was heated to reflux for 5 h after which the succinimide had floated to the surface of the solvent mixture. After allowing to cool to room temperature, the mixture was filtered through Celite® and washed with ether. The filtrate was collected and the solvent removed under reduced pressure. The residue was taken up in ether (100 cm$^3$) and the organic layer extracted with water (2×50 cm$^3$). The organic fraction was dried over MgSO$_4$ and the solvent removed under reduced pressure; to produce the crude product as an orange-coloured solid. Recrystallisation from boiling hexane yielded the bis bromomethyl product 10 as a colourless solid 10 (0.56 g, 21%). M.p. 127.5–128.5° C.; R$_f$ 0.32 (6:4 hexane:ethyl acetate v/v);

$\nu_{max}$ (neat)/cm$^{-1}$ 2875, 1451 (Ar), 1287, 1146, 1057 (C—O), 677 (C—Br);

$\delta_{H'}$ (250 MHz; CDCl$_3$) 7.09 (2H, s, Ar—H), 4.53 (4H, s, CH$_2$Br), 4.33 (4H, t, J 5.0, ArOCH$_2$), 4.00 (4H, J 5.0, ArOCH$_2$CH$_2$), 3.75 (8H, m, OCH$_2$);

$\delta_C$ (100 MHz; CDCl$_3$) 150.9 (C, Ar), 150.9 (C, Ar), 133.4 (C, Ar), 133.4 (C, Ar), 126.1 (CH, Ar), 126.1 (CH, Ar), 72.6 (CH$_2$), 72.6 (CH$_2$), 71.1 (CH$_2$), 71.1 (CH$_2$), 70.4 (CH$_2$), 70.4 (CH$_2$), 27.7 (CH$_2$), 27.7 (CH$_2$);

m/z (CI) 470 (M+NH$_4^+$, 58%), 390 (5), 312 (12), 44 (15);

Found (M+NH$_4^+$) 470.0178; C$_{16}$H$_{22}$O$_5$Br$_2$ requires 451.9835;

Found: C, 42.5; H, 4.8; Br, 35.2; C$_{16}$H$_{22}$O$_5$Br$_2$ requires C, 42.5; H, 4.9, Br 34.9%

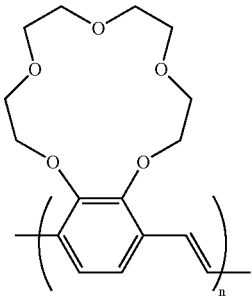

15C5-PPV, 2

A degassed solution of KO$^t$BU (0.1 g, 0.88 mmol) in dry THF (16 cm$^3$) was added slowly over 20 min to a degassed solution of the dibromide monomer 10 (0.2 g, 0.44 mmol) in dry THF, (16 cm$^3$) at room temperature. The reaction mixture was stirred at ambient temperature under nitrogen for 18 h, after which it was poured into methanol (600 cm$^3$) with stirring. The resultant yellow precipitate was collected, washed with methanol and dried in vacuo. The polymer was re-dissolved in minimum CHCl$_3$ and re-precipitated into methanol (600 cm$^3$). The solid was collected through filtration and dried in vacuo to afford the polymer 9 as an orange solid (75 mg, 58%).

$\nu_{max}$ (film)/cm$^{-1}$ 2925, 2867, 1492 (Ar), 1285, 1133 (C—O), 938 (trans-vinylene);

$\delta_H$ (400 MHz; CDCl$_3$) 7.50–7.25 (2H, br m, conjugated unit), 4.25 (4H, br m, ArOCH$_2$), 4.05 (4H, br m, ArOCH$_2$CH$_2$) 3.80 (8H, br m, OCH$_2$);

$\delta_C$ (100 MHz; CDCl$_3$) 150.5, 131.5, 121.0 (C, conjugated aromatic carbons), 71.5, 70.5, 70.5 (crown ether CH$_2$) (conjugated units not visible using 8,000 scans);

Found: C, 62.6; H, 6.8; Br, 1.4; [C$_{16}$H$_{20}$O$_5$]$_n$ requires C, 65.7; H, 6.9; Br, 0%.

GPC assay in CHCl$_3$ revealed M$_w$ 10.7×10$^6$, M$_n$ 126×10$^3$ and M$_w$/M$_n$ 84;

$\lambda_{max}$ (film)/nm 442.

Synthesis of Copolymers

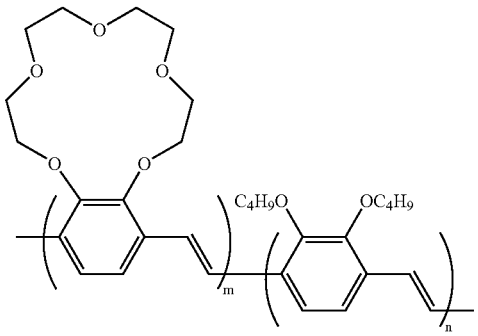

15C5-DB PPV Copolymer, 12

A degassed solution of KO$^t$Bu (0.26 g, 2.2 mmol) in dry THF (40 cm$^3$) was added slowly over 20 min to a degassed solution of a mixture of monomers, bis(bromomethyl)-benzo-15-crown-5 monomer 10 (0.2 g, 0.44 mmol) and 2,3-dibutoxy-1,4-bis(bromomethyl)benzene 6 (0.18 g, 0.44 mmol) in dry THF (40 cm$^3$) at room temperature. The reaction mixture was left stirring at ambient temperature under nitrogen for 6 h, and poured into methanol (500 cm$^3$) with stirring. The resultant orange precipitate was collected, washed with methanol and dried in vacuo. The polymer was re dissolved in minimum CHCl$_3$ and re-precipitated into methanol (500 cm$^3$). The solid was collected through filtration and dried in vacuo to afford the polymer as a bright orange solid (0.15 g, 35%).

$v_{max}$ (film)/cm$^{-1}$ 2956, 2869, 1436 (Ar), 1283, 1135 (C—O), 974 (trans-vinylene);

$\delta_H$(400 MHz; CDCl$_3$) 7.49–7.45 (H-conjugated units), 4.22–3.73 (2OH, m, br, OCH$_2$ & ArOCH$_2$), 1.84–1.57 (8H, m, br, CH$_2$), 1.03–0.99 (6H, m, br, CH$_3$);

m:n ratio determined by $^1$H NMR to be approximately 1:1;

Found C, 70.0; H, 7.8; Br, 0.9; [C$_{32}$H$_{42}$O$_7$]$_n$ requires C, 71.4; H, 7.8; Br, 0%;

GPC assay in CHCl$_3$ revealed M$_w$ 2.7×10$^6$ M$_n$ 24×10$^3$ and M$_w$/M$_m$ 110;

$\lambda_{max}$ (CHCl$_3$)/nm 442; L (film)/nm 452.

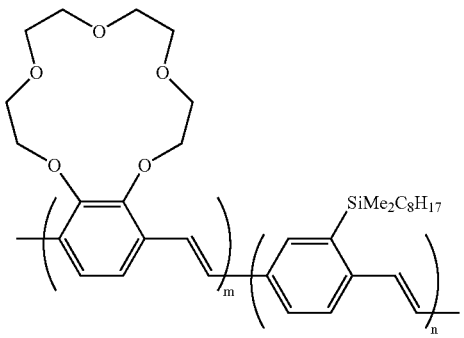

15C5-DMOS PPV Copolymer, 13

A degassed solution of KO$^t$Bu (0.16 g, 1.3 mmol) in dry THF (12 cm$^3$) was added slowly over 20 min to a degassed solution of a mixture of monomers, 10 (0.14 g, 0.3 mmol) and 2-methyloctylsilyl-1,4-bis(bromomethyl) benzene 11 (0.13 g, 0.3 mmol) in dry THF (13 cm$^3$) at room temperature. The reaction mixture was left stirring at ambient temperature under nitrogen for 8 h, after which it was poured into methanol (200 cm$^3$) with stirring. The resultant orange precipitate was collected, washed with methanol and dried in vacuo. The polymer was re-dissolved in minimum CHCl$_3$ and re-precipitated into methanol (200 cm$^3$). The solid was collected through filtration and dried in vacuo to afford the polymer as a right orange solid (0.13 g, 76%).

$v_{max}$ (film)/cm$^{-1}$ 2923, 2856, 1459 (Ar), 1283, 1137 (C—O), 937 (trans-vinylene);

$\delta_H$ (400 MHz; CDCl$_3$) 7.67–6.95 (9H, m, br, H-conjugated unit), 4.22 (4H s, br, ArOCH$_2$), 4.05 (4H, s, br, ArOCH$_2$CH$_2$), 3.79 (8H, s, br, OCH$_2$), 1.31–1.22 (12H, m, br, CH$_2$), 0.88 (5H, m, br, CH$_2$CH$_3$), 0.43–0.36 (6H, m, br, CH$_3$); min ratio determined by $^1$H NMR to be approximately 1:1;

Found C, 71.4; H, 8.3; Br, 1.9; [C$_{34}$H$_{48}$O$_5$Si]$_n$ requires C, 72.3; H, 8.6; Br, 0%;

GPC assay in CHCl$_3$ revealed M$_w$ 286×10$^3$ M$_n$ 37×10$^3$ and M$_w$/M$_n$ 7.7;

$\lambda_{max}$ (CHCl$_3$)/nm 434; $\lambda_{max}$ (film)/nm 442.

The PL efficiency and the EL efficiency of the copolymers 12 and 13 and the corresponding efficiencies of DMOS-PPV and 1 are shown in Table 1 below. In particular, the electroluminescence efficiency of 12 and 13 is high, whilst these copolymers still have good photoluminescence efficiencies.

TABLE 1

Summary of efficiency data for the polymers 12 and 13 in comparison with DMOS-PPV and DB-PPV 1.

| Polymer | PL efficiency[a] (%) | EL internal quantum efficiency[b] (Cd/A) |
|---|---|---|
| 15C5-DB PPV 12 | 38 | 0.35 |
| 15C5-DMOS PPV 13 | 48 | 0.3 |
| DMOS-PPV | 60 | not available |
| DB-PPV 1 | 40 | 0.015 |

[a]measurements made on films
[b]measurements made on ITO/polymer/Al devices, thickness 100—200 nm.

REFERENCES

U.S. Pat. No. 3,401,152, Wessling et al.
U.S. Pat. No. 5,558,904, Hsieh et al.
U.S. Pat. No. 5,189,136, Wudl, F.
J. H Burroughes et al., Nature, 1990, 365, 47.
H. G. Gilch et al., J. Poly. Sci. 1-A, 1966, 4, 1337.
B. R. Hsieh et al., Adv. Mater. 1995, 7, 36.
WO 95/32526, Staring & Demandt
H. Antoniadis et al., Poly. Adv. Tech., 1997, 8, 392

What is claimed is:

1. A compound comprising a film-forming conjugated poly(1,4-arylene vinylene) compound having a 1,4-phenylene vinylene unit with adjacent substituents, said substituents being oriented such as to affect the electronic structure of the compound sufficiently to cause a blue-shift in the photoluminescence and/or electroluminescence of the compound, wherein the substituents are independently selected from:

(i) R—, RO—, RS—, and RR'N— wherein R and R' are independently: a straight or branched chain alkyl group, alkenyl group, or alkynyl group having 1–10 carbon atoms; or an aromatic or non-aromatic heterocyclic group; and (ii) a group in which the adjacent substituents together form a cyclic group, the cyclic group containing, in addition to the two carbon atoms of the arylene unit to which it is attached, 1–10 carbon atoms and 0 or 1–6 hetero atoms selected from O, S and N.

2. A compound according to claim 1, wherein the cyclic group contains 2–6 hetero atoms.

3. A compound according to claim 1, wherein one or both of the adjacent substituents are independently selected from a branched alkyl group and a branched alkoxy group.

4. A compound according to claim 1, wherein each of the carbon atoms at the adjacent substituted positions of the aryl uni is attached to its substituent via a hetero atom, selected from O, S or N.

5. A compound according to claim 1, wherein one or both of the adjacent substituents are independently selected from butyloxy, ethylhexyloxy and 3',7'-dimethyloctyloxy groups.

6. A compound according to claim 1, wherein the poly (arylene vinylene) is a co-polymer comprising a fluorescent unit carrying a distyryl-2,3-substituted-benzene fragment.

7. A compound according to claim 1, wherein the adjacent substituents are in the 2-position and the 3-position of the phenylene residue.

8. A compound according to claim 7, of formula (I):

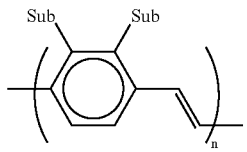

wherein Sub is a substituent as defined in claim 1, the vinylene unit may be a trans vinylene unit or a cis vinylene unit, and n is the number of units of the formula in the polymer.

9. A compound according to claim 7, of formula (II) or formula (III):

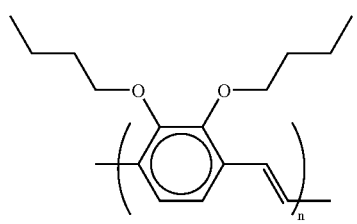

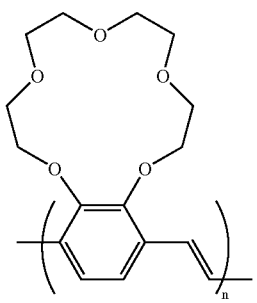

wherein the vinylene unit may be a trans vinylene unit or a cis vinylene unit, and n is the number of units of the respective formula in the polymer.

10. A method for the production of a compound as defined in claim 1, which method comprises polymerising a bis (halomethyl) substituted phenyl monomer in the presence of a base to form a poly(arylene vinylene), wherein the phenyl monomer has adjacent substituents on the phenyl residue.

11. A method according to claim 10, wherein the monomer is a bis(chloromethyl), bis(bromomethyl) or bis (iodomethyl) monomer.

12. A method according to claim 10, wherein the base is potassium tertiary butoxide.

13. A component or device comprising a compound as defined in claim 1.

14. A component or device according to claim 13, further comprising an electric, electronic, optical or optoelectronic component or device.

15. A component or device according to claim 13, further comprising a photoluminescent or electroluminescent component or device.

16. A light emitting diode comprising a component or device as defined in claim 13.

17. A method for producing a component or device, which method comprises coating a solution of a compound as defined in claim 1 onto a substrate to form a film.

18. A method according to claim 17, wherein the substrate is ITO.

19. A method according to claim 17, wherein the solution is a chloroform solution.

20. A method according to claim 17, wherein the solution is spin-coated onto the substrate.

21. A light emitting diode having a coating of a compound according to claim 1.

22. An electric, electronic, optical or optoelectronic component or device having a coating comprising a film-forming conjugated poly(1,4-arylene vinylene) compound having a 1,4-phenylene vinylene unit with adjacent substituents which produces blue-shifted electroluminescence or photoluminescence, wherein the substituents are independently selected from:

(i) R—, RO—, RS—, and RR'N— wherein R and R' are independently: a straight or branched chain alkyl group, alkenyl group, or alkynyl group having 1–10 carbon atoms; or an aromatic or non-aromatic heterocyclic group; and (ii) a group in which the adjacent substituents together form a cyclic group, the cyclic group containing, in addition to the two carbon atoms of the arylene unit to which it is attached, 1–10 carbon atoms and 0 or 16 hetero atoms selected from O, S and N.

23. A compound comprising a film-forming conjugated poly(phenylene vinylene) compound having a 1,4-phenylene vinylene unit with adjacent substituents, said substituents being oriented such as to affect the electronic structure of the compound sufficiently to cause a blue-shift in the photoluminescence and/or electroluminesence of the compound, wherein the adjacent substituents are in the 2-position and the 3-position of the phenylene residue, wherein the compound is of formula (II) or formula (III):

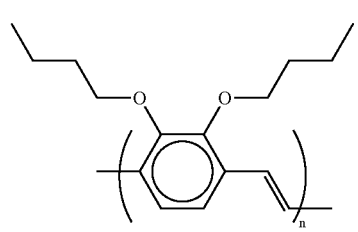

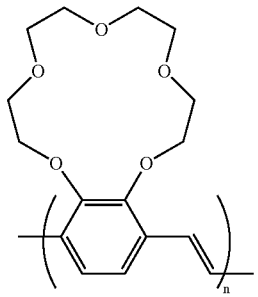

wherein the vinylene unit may be a trans vinylene unit or a cis vinylene unit, and n is the number of units of the respective formula in the polymer.

24. A compound comprising a film-forming conjugated poly(1,4-arylene vinylene) compound, said poly(1,4-arylene vinylene) compound being soluble in organic solvents and having a 1,4-phenylene vinylene unit with adjacent substituents, said substituents being oriented such as to affect the electronic structure of the compound sufficiently to cause a blue-shift in the photoluminescence and/or electroluminescence of the compound.

25. An electric, electronic, optical or optoelectronic component or device having a coating comprising a film-forming conjugated poly(1,4-arylene vinylene) compound, said poly (1,4-arylene vinylene) compound being soluble in organic solvents and having a 1,4-phenylene vinylene unit with adjacent substitutents which produces blue-shifted electroluminescence or photoluminescence.

26. A process for directly obtaining a film-forming conjugated poly(1,4-arylene vinylene) compound having a 1,4-phenylene vinylene unit with adjacent substituents, said substituents being oriented such as to affect the electronic structure of the compound sufficiently to cause a blue-shift in the photoluminescence and/or electroluminescence of the compound, said process comprising a step of dehydrohalogenation condensation polymerisation comprising subjecting a solution comprising 2,3 disubstituted bishalomethylbenzene monomers to polymerisation with at least two equivalents of base.

27. A compound comprising a film-forming conjugated poly(1,4-arylene vinylene) compound having groups so as to render the conjugated poly(1,4-arylene vinylene) compound soluble in organic solvents, the compound having a 1,4-phenylene vinylene unit with adjacent substituents, said substituents being oriented such as to affect the electronic structure of the compound sufficiently to cause a blue-sift in the photoluminescence and/or electroluminescence of the compound.

28. An electric, electronic, optical or optoelectronic component or device having a coating comprising a film-forming conjugated poly(1,4-arylene vinylene) compound having groups so as to render the conjugated poly(1,4-arylene vinylene) compound soluble in organic solvents and having a 1,4-phenylene vinylene unit with adjacent substituents which produces blue-shifted electroluminescence or photoluminescence.

* * * * *

UNITED STATES PATENT AND TRADEMARK OFFICE
CERTIFICATE OF CORRECTION

PATENT NO. : 7,049,010 B1
APPLICATION NO. : 09/529873
DATED : May 23, 2006
INVENTOR(S) : Holmes et al.

It is certified that error appears in the above-identified patent and that said Letters Patent is hereby corrected as shown below:

Col. 14, line 55,
The third line of claim 4 should read:

...unit is attached to its substituent via a hetero atom, selected....

Signed and Sealed this

Twenty-second Day of August, 2006

JON W. DUDAS
*Director of the United States Patent and Trademark Office*